(12) United States Patent
Mori

(10) Patent No.: US 7,075,319 B2
(45) Date of Patent: Jul. 11, 2006

(54) PROBE CARD HAVING A COIL SPRING INTERPOSED BETWEEN A SUPPORT MEMBER AND A CONTACTOR UNIT

(75) Inventor: Chikaomi Mori, Yamaga (JP)

(73) Assignee: Nihon Denshizairyo Kabushiki Kaisha, Amagasaki (JP)

( * ) Notice: Subject to any disclaimer, the term of this patent is extended or adjusted under 35 U.S.C. 154(b) by 0 days.

(21) Appl. No.: 10/622,464

(22) Filed: Jul. 21, 2003

(65) Prior Publication Data

US 2004/0104738 A1 Jun. 3, 2004

(30) Foreign Application Priority Data

Aug. 9, 2002 (JP) .............................. 2002-233979

(51) Int. Cl.
*G01R 31/02* (2006.01)
*G01R 31/26* (2006.01)

(52) U.S. Cl. ...................................... 324/754; 324/765

(58) Field of Classification Search ........ 324/754–755, 324/757–758, 761–762, 765; 439/66–71; 361/772, 774; 438/14–18
See application file for complete search history.

(56) References Cited

U.S. PATENT DOCUMENTS

| 4,987,365 | A | | 1/1991 | Shreeve et al. ............. 324/158 |
| 5,506,498 | A | | 4/1996 | Anderson et al. ......... 324/158.1 |
| 5,825,192 | A | * | 10/1998 | Hagihara .................... 324/757 |
| 5,850,148 | A | | 12/1998 | Nam ........................... 324/761 |
| 5,905,382 | A | * | 5/1999 | Wood et al. ................ 324/758 |
| 6,078,186 | A | | 6/2000 | Hembree et al. ........... 324/755 |
| 6,130,543 | A | | 10/2000 | Iino ............................ 324/754 |
| 6,340,604 | B1 | * | 1/2002 | Tsuura ........................ 324/754 |
| 6,509,751 | B1 | * | 1/2003 | Mathieu et al. ............. 324/754 |
| 6,563,330 | B1 | * | 5/2003 | Maruyama et al. ......... 324/754 |
| 6,566,150 | B1 | * | 5/2003 | Kohno et al. .................. 438/14 |
| 6,640,415 | B1 | * | 11/2003 | Eslamy et al. .............. 324/754 |
| 6,661,247 | B1 | * | 12/2003 | Maruyama et al. ......... 324/755 |
| 6,737,882 | B1 | * | 5/2004 | Wood et al. ................. 324/765 |

FOREIGN PATENT DOCUMENTS

| JP | 07-066249 | 3/1995 |
| WO | WO 00/33096 | 6/2000 |

(Continued)

OTHER PUBLICATIONS

Copy of European Search Report dated Sep. 26, 2005, 2 pages (double-sided).

*Primary Examiner*—Jermele Hollington
(74) *Attorney, Agent, or Firm*—Armstrong, Kratz, Quintos, Hanson & Brooks, LLP

(57) ABSTRACT

A probe card including a substrate body, a contactor unit provided below the substrate body for establishing an electrical contact with the subject to be tested as well as for establishing an electrical contact with the substrate body, a supporting device for supporting the contactor unit from below with elastic force and parallelism adjusting screws that come in contact with the contactor unit from above in a vertical direction for adjusting a degree of parallelism of the contactor unit. In particular, the supporting device is configured to include a coil spring interposed toward a vertical direction between a flange section provided at the inside section of the support member arranged below the substrate body and a flange section provided at the outside section of the contactor unit.

7 Claims, 4 Drawing Sheets

FOREIGN PATENT DOCUMENTS

| | | |
|---|---|---|
| WO | WO 00/45433 | 8/2000 |
| WO | WO 01/01247 A2 | 1/2001 |
| WO | WO 01/01247 A3 | 1/2001 |
| WO | WO 01/71779 A2 | 9/2001 |
| WO | WO 01/71779 A3 | 9/2001 |
| WO | WO 02/061442 | 8/2002 |

* cited by examiner

PROBE CARD HAVING A COIL SPRING INTERPOSED BETWEEN A SUPPORT MEMBER AND A CONTACTOR UNIT

BACKGROUND OF THE INVENTION

1. Field of the Invention

The present invention relates to a probe card for evaluating electrical characteristics of a semiconductor device or the like.

2. Description of the Related Art

In recent years, a plurality of chips are simultaneously tested in a wafer test with a probe card. There has conventionally been well-known a probe card shown in FIG. 4 having a contactor unit 300 including a contactor that establishes an electrical contact with a semiconductor device that is a subject to be tested and a substrate body 100, those of which are discretely fabricated. In this type of probe card, the substrate body 100 and the contactor unit 300 are electrically connected via an interposer 200.

A leaf spring 450 is fixed below the substrate body 100 so that its free end projects inwardly. The contactor unit 300 is supported by the leaf spring 450 from below and has parallelism adjusting means 500 for adjusting a parallelism of the contactor unit 300 provided so as to be in contact with the upper surface thereof.

The parallelism adjusting means 500 comprises a parallelism adjusting screw 520 threadedly secured to a reinforcing plate 650 fixed above the substrate body 100 so that its leading edge projects downwardly via a bore hole formed on the substrate body 100 and a ball 530 provided at the leading edge (downward) of the parallelism adjusting screw 520 so as to be in contact with the contactor unit 300, wherein the degree of parallelism of the contactor unit 300 is adjusted by changing the projection amount of the parallelism adjusting screw 520.

However, the contactor unit 300 may be deformed or broken in the conventional probe card, in the case where an adjusting stroke is excessively exerted on the parallelism adjusting screw 520 upon adjusting the degree of parallelism. Specifically, the leaf spring 450 that supports the contactor unit 300 has a great amount of pressure change in view of its characteristic, whereby excessive force is exerted on the contactor unit 300 to thereby produce a deformation or damage of the contactor unit 300 by this force. The deformation or damage of the contactor unit 300 has a problem of entailing non-uniform height of the contactor to thereby bring about a defective continuity to the subject to be tested. Similarly, the above-mentioned deformation or damage also has a problem of bringing about a defective continuity to the interposer 200.

Further, in the conventional probe card, the leaf spring 450 is arranged such that one end thereof is fixed to a leaf spring holder 460 fixed below the substrate body 100 and the inwardly projecting free end thereof supports the contactor unit 300. Additionally, reinforcing plates 640 and 650 are fixed independently at the inside and outside above the substrate body 100, the outward reinforcing plate 640 arranged at the position above the leaf spring holder 460 and the inward reinforcing plate 650 arranged at the position inwardly from the outward reinforcing plate 640 and above the free end of the leaf spring 450. Secured threadedly to this inward reinforcing plate 650 is the above-mentioned parallelism adjusting screw 500. Therefore, force exerted by the leaf spring 450 is exerted downwardly on the leaf spring holder 460, and exerted upwardly on the inward reinforcing plate 650. Because the outward reinforcing plate 640 positioned above the leaf spring holder 460 and the inward reinforcing plate 650 positioned above the free end of the leaf spring are independently provided as described above, the force by the leaf spring 450 is exerted on the substrate body 100 in different directions such as in an upward direction and a downward direction depending upon a place, whereby a deformation occurs on the substrate body 100 resulting from the force by the leaf spring 450. This deformation is likely to cause an electrically defective continuity.

Further, a temperature difference of each component member is produced in a test under a high temperature, whereby a warp of the overall substrate body is produced by the difference in a distortion amount of each component member based upon this temperature difference, thereby entailing a problem that electrical defective continuity is brought about as a result of this warp. This problem is eliminated by using a material having a coefficient of thermal expansion adjusted corresponding to the temperature difference of each component member so as to prevent the occurrence of the warp, but it is practically impossible to completely prevent the occurrence of the warp by finely adjusting the coefficient of thermal expansion of the material.

SUMMARY OF THE INVENTION

The present invention is designed in view of the above-mentioned background, and aims to provide a probe card that prevents a deformation of a component member such as a contactor unit or the like and capable of performing a test under a satisfactory continuity condition.

A probe card of the present invention is a probe card used for performing an electrical test of a subject to be tested that is a semiconductor device or the like and comprising a substrate body, a contactor unit provided at one side of the substrate body for establishing an electrical contact with the subject to be tested as well as for establishing an electrical contact with the substrate body via an interposer, supporting means for supporting one side of the contactor unit with elastic force and parallelism adjusting means that comes in contact with the other side of the contactor unit in a vertical direction for adjusting a parallelism of the contactor unit, wherein the supporting means is configured to include a support member arranged at one side of the substrate body and a coil spring interposed toward a vertical direction between a flange section provided at an inside section of the support member and a flange section provided at an outside section of the contactor unit.

Further, it is preferable to adopt a configuration that a first reinforcing plate which is in contact with the substrate body is arranged at the other side of the substrate body. It is more preferable in this case to adopt a configuration that the support member is attached to the first reinforcing plate via a spacer that is inserted into a bore hole formed on the substrate body.

Further, a preferable configuration is such that a heat-conductive sheet is provided between the substrate body and the first reinforcing plate. Similarly, a heat-conductive sheet may be provided between the spacer and the first reinforcing plate and between the spacer and the support member respectively.

Further, a screw may be used for the parallelism adjusting means. Specifically, a configuration may be adopted such that the screw is threadedly secured to the first reinforcing plate so as to cause its leading edge to be in contact with the contactor unit via a hole formed on the substrate body. In this case, it is preferable to adopt a configuration such that a second reinforcing plate is attached to the first reinforcing plate for covering the hole formed on the first reinforcing plate and a screw is threadedly secured to the second reinforcing plate so as to cause its leading edge to be in contact with a section of the substrate body corresponding to a position above the contactor unit via the above-mentioned hole.

Moreover, it is preferable to adopt a configuration of providing a heat-conductive sheet between the first reinforcing plate and the second reinforcing plate.

DESCRIPTION OF THE PREFERRED EMBODIMENTS

Figure 1:
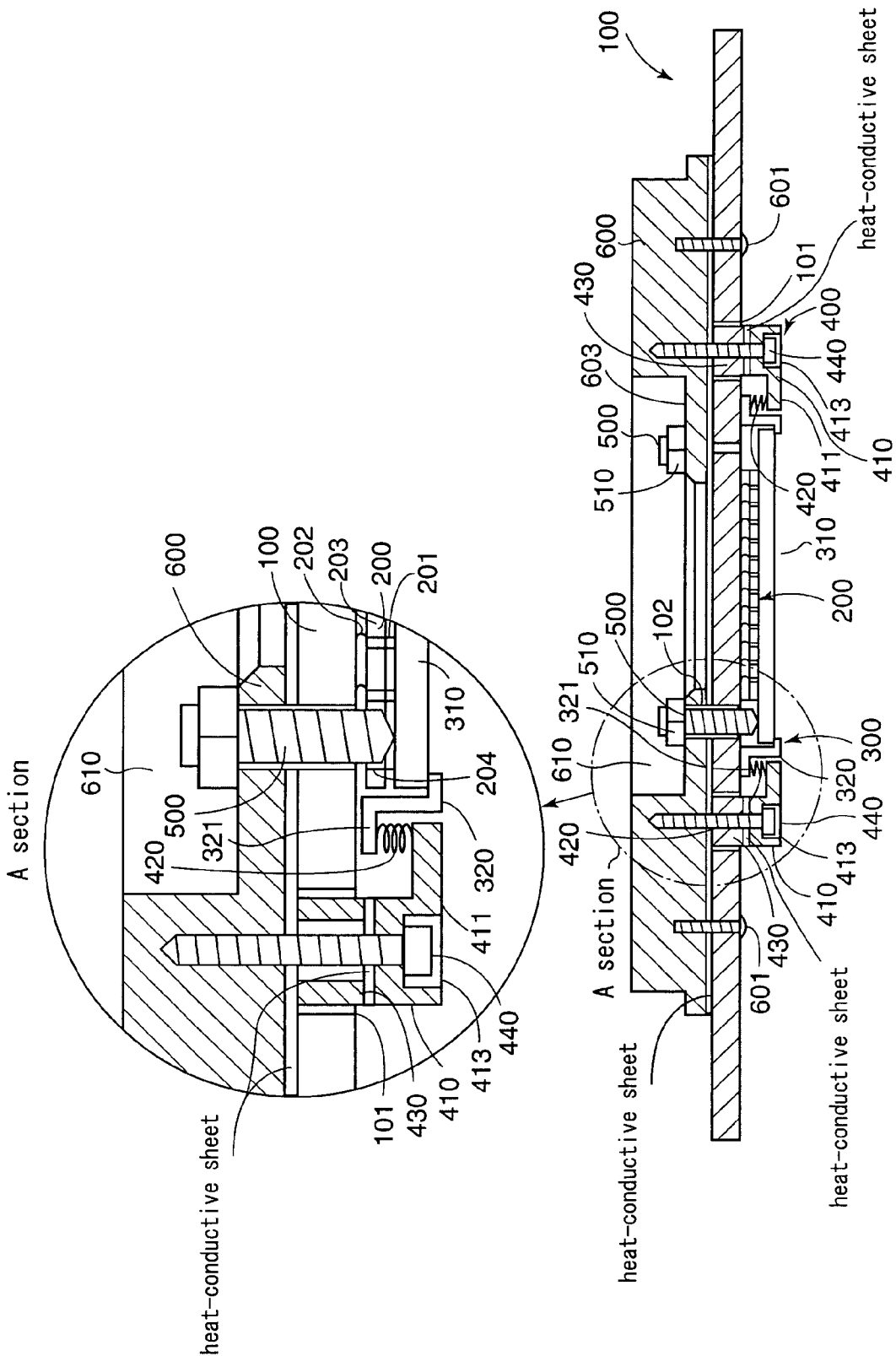
FIG. 1 is a partial cross sectional view in section for explaining a probe card according to a first embodiment of the present invention.
Figure 2:
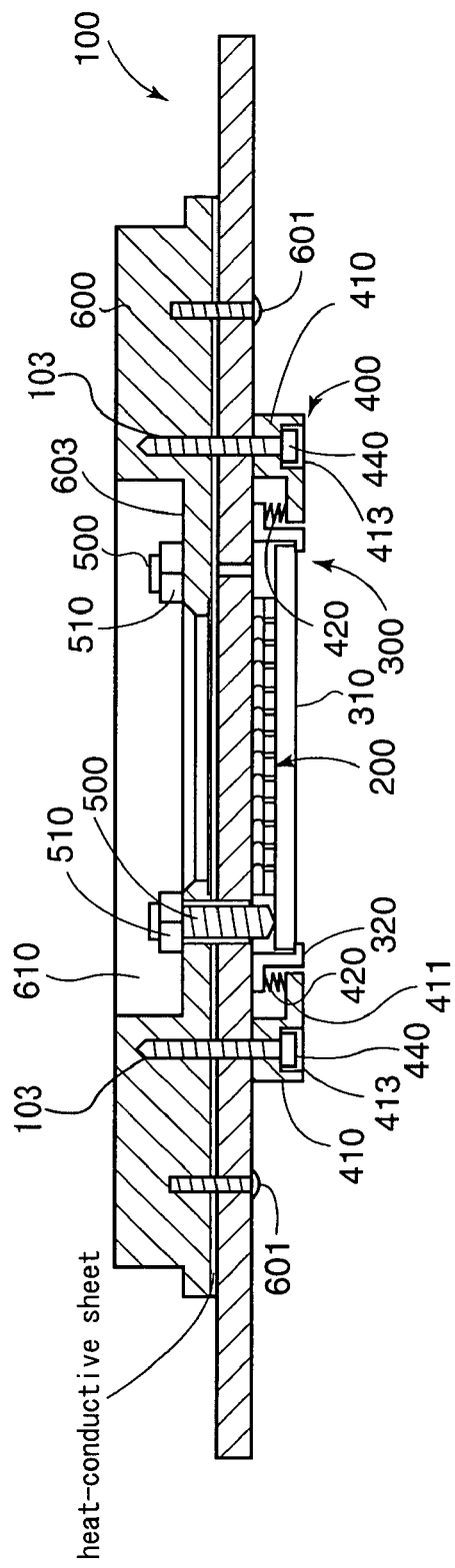
FIG. 2 is a partial cross sectional view schematically showing a probe card according to a second embodiment of the present invention.
Figure 3:
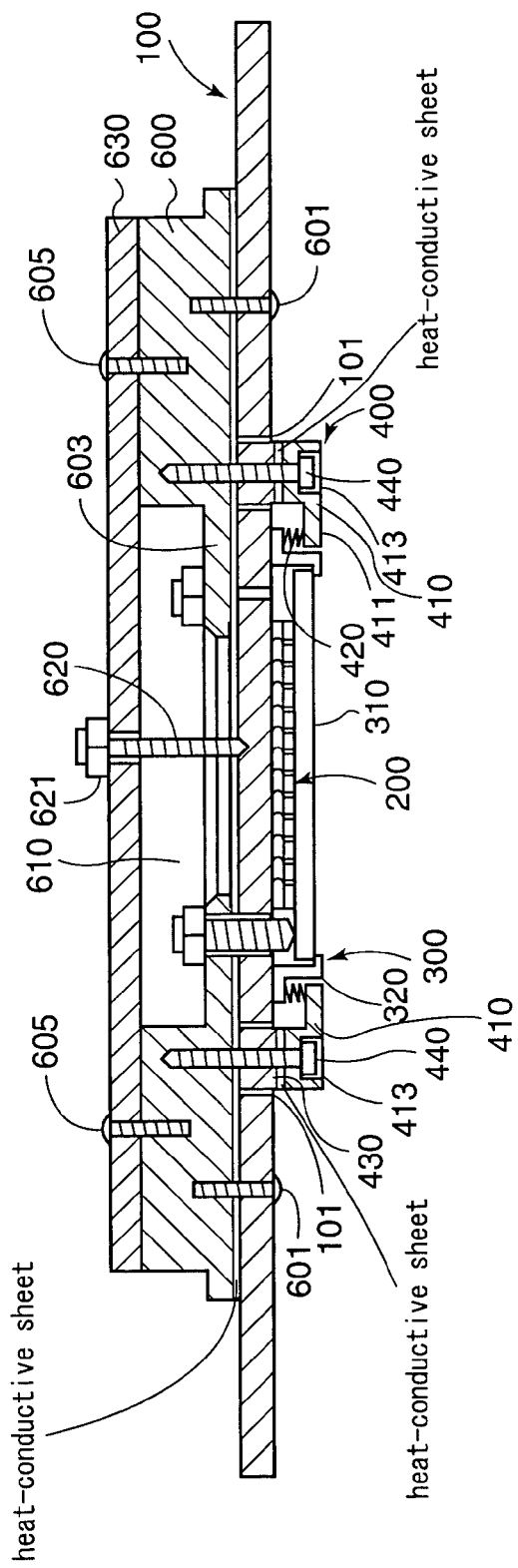
FIG. 3 is a partial cross sectional view schematically showing a probe card according to a third embodiment of the present invention.
Figure 4:
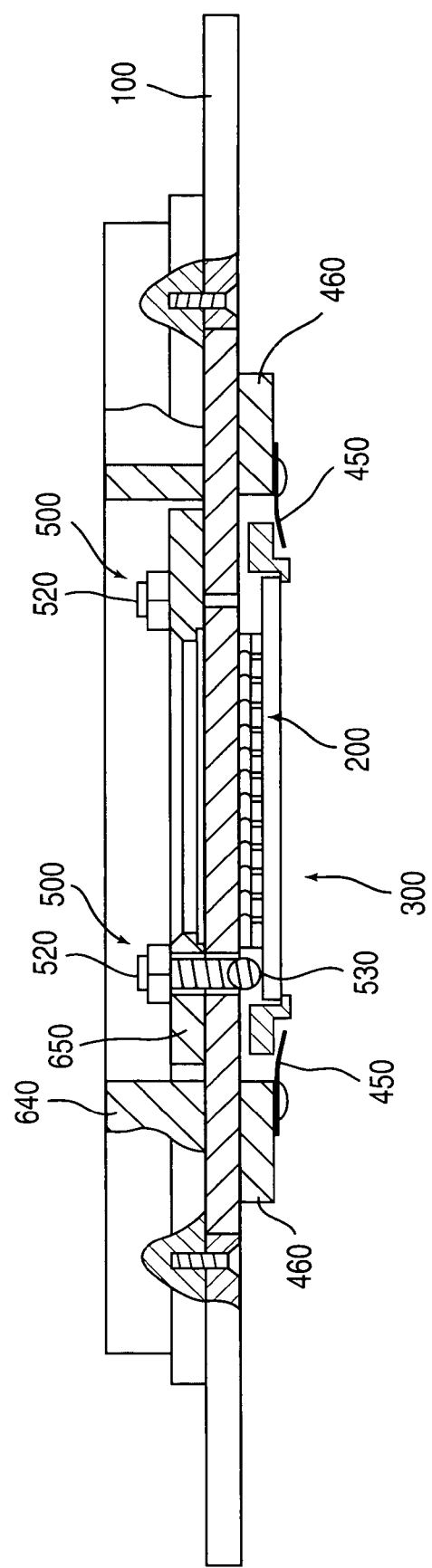
FIG. 4 is a cross sectional view schematically showing a conventional probe card.

An embodiment of a probe card according to the present invention will be explained hereinbelow with reference to FIGS. 1 to 3. FIG. 1 is a partial cross sectional view schematically showing a probe card according to a first embodiment of the present invention, FIG. 2 is a partial cross sectional view schematically showing a probe card according to a second cross embodiment of the present invention and FIG. 3 is a partial sectional view schematically showing a probe card according to a third embodiment of the present invention.

FIRST EMBODIMENT

A probe card according to the first embodiment is used for performing an electrical test of a subject to be tested that is a semiconductor device or the like and comprises a substrate body 100, a contactor unit 300 provided below the substrate body 100 for establishing an electrical contact with the subject to be tested as well as for establishing an electrical contact with the substrate body 100 via an interposer 200, supporting means 400 for supporting the contactor unit 300 from below with elastic force, a parallelism adjusting screw 500 that serves as parallelism adjusting means and comes in contact with the contactor unit 300 from above in a vertical direction for adjusting a degree of parallelism of the contactor unit 300 and a reinforcing plate 600 (corresponding to a first reinforcing plate) that comes in fixed contact with the upper section of the substrate body 100.

The substrate body 100 has a wiring pattern or the like formed on its surface and electrically connectable to a tester not shown. The tester performs an evaluation of electrical characteristic of the subject to be tested.

The reinforcing plate 600 is a substrate having a circular hole 610 formed on a central section of its upper surface, comes in contact with the substrate body 100 and fixed by a setscrew 601. A screw having a horizontal screw head, for example such as a pan-head screw, is used for the setscrew 601. Therefore, a displacement between the substrate body 100 and the reinforcing plate 600 in the horizontal direction can easily be adjusted.

The hole 610 on the reinforcing plate 600 has a step portion, and three parallelism adjusting screws 500 in total are threadedly secured to a disk-like projecting section 603 corresponding to its inner bottom surface with a pitch interval of 120 degrees. A locking nut 510 for regulating a rotation is threadedly secured to the parallelism adjusting screw 500 so as to prevent careless rotation.

The leading edge of the parallelism adjusting screw 500 comes in contact with the contactor unit 300 via a hole 102 formed on the substrate body 100. The leading edge of the parallelism adjusting screw 500 is formed to have a curved surface, whereby a ball conventionally used is not required.

The contactor unit 300 comprises a needle unit 310 having attached to a circular substrate a plurality of contactors that are in contact with the subject to be tested to establish an electrical connection therebetween and a needle unit holder 320 in the form of a ring for supporting the outer peripheral section of the needle unit 310 from below. The needle unit holder 320 has a reversed L-shape in cross section, the outside section of which forms a ring-like flange section 321.

The interposer 200 is a relay terminal block for providing an electrical connection between a wiring pattern or the like formed on the upper surface of the needle unit 310 of the contactor unit 300 and a wiring pattern or the like formed on the lower surface of the substrate body 100, and includes a lower probe 201 having a leading edge being in contact with the wiring pattern or the like at the side of the needle unit 310, an upper probe 202 having a leading edge being in contact with the wiring pattern or the like at the side of the substrate body 100 and a substrate 203 having each of the other edges of the upper and lower probes 201 and 202 fixed thereto and a pattern formed thereon for electrically connecting each probe. A hole 204 for passing the parallelism adjusting screw 500 is formed on the substrate 203.

The supporting means 400 is configured to include a ring-like support member 410 arranged at one side of the substrate body 100 and having an L-shape in cross section and a coil spring 420 interposed between the contactor unit 300 and the support member 410 toward the vertical direction. The inside section of the support member 410 becomes a ring-like flange section 411. Specifically, a plurality of coil springs 420 are interposed between the flange section 321 of the needle unit holder 320 and the flange section 411 of the support member 410.

The support member 410 is attached to the reinforcing plate 600 by using the setscrew 440 via a height-adjusting spacer 430 inserted into the bore hole 101 formed on the substrate body 100. An accommodating recess section 413 for accommodating the head section of the setscrew 440 is formed at the support member 410 for preventing the head section of the setscrew 440 from projecting to the downward side (to the side of the subject to be tested).

Both of the support member 410 and the needle unit holder 320 of the contactor unit 300 have a surface opposite to the subject to be tested (lower surface) in the form of a mirror surface having a surface roughness of Ry 6.3 or below or Rz 6.3 or below. This mirror surface reflects radiation heat or the like, thereby restraining the support member 410 or the like from having a high temperature.

Heat-conductive sheets are interposed between the substrate body 100 and the reinforcing plate 600, between the reinforcing plate 600 and the spacer 430 and between the spacer 430 and the support member 410. This reduces the temperature difference among each member to restrain a warp caused by the temperature difference among each member.

In the probe card having the above-mentioned configuration, the contactor unit 300 is supported by the coil spring 420 interposed between the support member 410 and the contactor unit 300 toward the vertical direction, whereby a rate of change of compressive force to the stroke amount is small compared to the conventional one supporting with a leaf spring, thereby obtaining a satisfactory linearity of the stroke amount and elastic force. Accordingly, a damage or deformation of the needle unit holder 320 can accurately be prevented, as well as the parallelism of the contactor unit 300 can easily be adjusted.

Moreover, the support member 410 is attached to the reinforcing plate 600 via the spacer 430, so that the elastic force of the coil spring 420 is not directly exerted on the substrate body 100, thereby preventing the substrate body 100 from being deformed. Further, the heat-conductive sheet is interposed between the substrate body 100 and the reinforcing plate 600 or the like, resulting in providing satisfactory heat conduction among each of these members to thereby be capable of preventing a warp caused by the temperature difference among each of these members. Consequently, high accuracy of position is realized between the subject to be tested and the contactor unit 300, between the contactor unit 300 and the interposer 200 and between the interposer 200 and the substrate body 100, with the result that the evaluation can be performed under satisfactory continuity condition.

SECOND EMBODIMENT

Subsequently explained is a probe card according to a second embodiment, in which same numerals are given to members having the same configuration and function as those of the first embodiment for omitting their detailed explanations.

The probe card according to the second embodiment greatly differs from the first embodiment only in that the support member 410 is attached to the reinforcing plate 600 by using the setscrew 440 without using the spacer 430. Because the setscrew 440 is insertedly penetrated into the bore hole 103 formed on the substrate body 100, the elastic force of the coil spring 420 is not directly exerted on the substrate body 100, to thereby be capable of preventing the deformation of the substrate body 100. This is the same as the first embodiment.

Further, the heat-conductive sheet is interposed between the substrate body 100 and the reinforcing plate 600 and between the substrate body 100 and the support member 410 respectively, thereby being capable of reducing the temperature difference among each member like the first embodiment. This can prevent the warp caused by the temperature difference among each member, that is also the same as the first embodiment.

THIRD EMBODIMENT

Subsequently explained is a probe card according to a third embodiment, in which same numerals are given to members having the same configuration and function as those of the first and second embodiments for omitting their detailed explanations.

The probe card according to the third embodiment greatly differs from the first embodiment only in that a reinforcing plate 630 is attached to the reinforcing plate 600 by set screws 605 for covering the hole 610 and the reinforcing plate 630 has a screw 620 threadedly secured thereto so as to cause its leading edge to be in contact with a section of the substrate body 100 corresponding to a position above the contactor unit 310 via the hole 610. A locking nut 621 is threadedly secured to the screw 620 for preventing a careless rotation. The leading edge of the screw 620 is formed to have a curved surface. Further, a heat-conductive sheet is interposed between the reinforcing plate 600 and the reinforcing plate 630.

The elastic force of the coil spring 420 is exerted on the substrate body 100 via the contactor unit 320 and the interposer 200, so that the central section of the substrate body 100 is likely to upwardly warp, but because this section is pressed by the screw 620, the deformation of the substrate body 100 is accurately prevented together with the configuration that the heat-conductive sheet is interposed between the reinforcing plate 620 and the reinforcing plate 630. Therefore, high accuracy of position is realized between the subject to be tested and the contactor unit 300, between the contactor unit 300 and the interposer 200 and between the interposer 200 and the substrate body 100, with the result that the evaluation can be performed under satisfactory continuity condition.

Although the spacer 430 is interposed between the support member 410 and the reinforcing plate 600 in the third embodiment like the first embodiment, the configuration can be adopted wherein the spacer 430 is not interposed like the second embodiment.

The probe card of the present invention is not limited to the above-mentioned embodiments. For example, a contactor unit having any type of configuration can be used so long as it has functions of establishing an electrical contact with the subject to be tested and establishing an electrical contact with the substrate body via the interposer. This is similarly applied to the parallelism adjusting means. Further, a supporting means having any type of configuration can be used so long as it has a function of supporting one side of the contactor unit with an elastic force by using the coil spring interposed toward the vertical direction between the flange section provided at the inside section of the support member and the flange section provided at the outside section of the contactor unit. Additionally, a configuration may be adopted wherein the reinforcing plate is omitted.

According to a probe card of the present invention, a contactor unit is supported by a coil spring interposed between a support member and a contactor unit toward a vertical direction, whereby a rate of change of compressive force to a stroke amount is small compared to the conventional one supporting with a leaf spring, thereby obtaining a satisfactory linearity of the stroke amount and elastic force. Accordingly, a damage or deformation of a needle unit holder can accurately be prevented, as well as the parallelism of a contactor unit can easily be adjusted. As a result, the evaluation can be performed under satisfactory continuity condition.

In the case where a first reinforcing plate that is in contact with the substrate body is arranged at the other side of the substrate body, the deformation of the substrate body can be prevented by the first reinforcing plate. Further, in the case where the support member is attached to the first reinforcing plate via a spacer inserted into a bore hole formed on the substrate body, the elastic force of the coil spring is not directly exerted on the substrate body, thereby being capable of accurately preventing the deformation of the substrate body. With this, high accuracy of position is realized between the subject to be tested and the contactor unit, between the contactor unit and the interposer and between the interposer and the substrate body, with the result that the evaluation can be performed under satisfactory continuity condition.

In the case where a heat-conductive sheet is provided between the substrate body and the first reinforcing plate or the like, the warp caused by the temperature difference among each member can be prevented, with the result that the evaluation can be performed under satisfactory continuity condition.

In the case where a second reinforcing plate is attached to the first reinforcing plate for covering a hole formed on the first reinforcing plate and the second reinforcing plate has a screw threadedly secured thereto so as to cause its leading edge to be in contact with a section of the substrate body corresponding to a position above the contactor unit via the hole, the elastic force of the coil spring is exerted on the substrate body via the contactor unit and the interposer, so that the central section of the substrate body is likely to warp in an upward direction, but because this section is pressed by the screw, the deformation of the substrate body is accurately prevented, and consequently, the evaluation can be performed under satisfactory continuity condition.

What is claimed is:

1. A probe card used for performing an electrical test of a subject to be tested that is a semiconductor device or the like and comprising:
    a substrate body;
    a contactor unit, one surface thereof oriented to face one surface of the substrate body and the other surface of the contactor unit is provided with a plurality of contactors capable of electrical contact with electrodes of the subject to be tested;
    supporting means for supporting the contactor unit with elastic force; and
    a plurality of parallelism adjusting means provided with the substrate body and for adjusting a degree of parallelism of the contactor unit, wherein
    said contactor unit is provided with a flange section at an outside section thereof,
    wherein the supporting means is configured to include a support member and a coil spring, the support member being provided in the substrate body and having a flange section facing said flange section of the contactor unit at a greater distance than the contactor unit from the substrate body, the coil spring being interposed between said flange section of the support member and said flange section of the contactor unit for urging the contactor unit toward the substrate body, and
    wherein said parallelism adjusting means pushes a surface of the contactor unit in a manner to get away from the substrate body against the urging force applied by the coil spring to thereby adjust a spacing between the contactor unit and the substrate body.

2. The probe card claimed in claim 1, wherein a first reinforcing plate that comes in contact with the substrate body is arranged at the other side of the substrate body.

3. The probe card claimed in claim 2, wherein the support member is attached to the first reinforcing plate via a spacer inserted into a bore hole formed on the substrate body.

4. The probe card claimed in claim 2, wherein a heat-conductive sheet is provided between the substrate body and the first reinforcing plate.

5. The probe card claimed in claim 3, wherein heat-conductive sheets are provided respectively between the substrate body and the first reinforcing plate, between the spacer and the first reinforcing plate and between the spacer and the support member.

6. The probe card claimed in any one of claims 2 to 5, wherein a screw serving as the parallelism adjusting means is threadedly secured to the first reinforcing plate so as to cause its leading edge to be in contact with the contactor unit via a hole formed on the substrate body, while a second reinforcing plate is attached to the first reinforcing plate for covering the hole formed on the first reinforcing plate and a screw is threadedly secured to the second reinforcing plate so as to cause its leading edge to be in contact with a position of the substrate body above the contactor unit via the hole.

7. The probe card claimed in claim 6, wherein a heat-conductive sheet is provided between the first reinforcing plate and the second reinforcing plate.

* * * * *